United States Patent

Sakai et al.

Patent Number: 6,025,646
Date of Patent: Feb. 15, 2000

[54] VERTICAL MOSFET HAVING PENETRATING WIRING LAYERS

[75] Inventors: Eishirou Sakai; Kazuo Yamagishi; Haruki Sakaguchi; Hideyuki Tokuno, all of Shiga, Japan

[73] Assignee: NEC Corporation, Tokyo, Japan

[21] Appl. No.: 09/159,582

[22] Filed: Sep. 24, 1998

[30] Foreign Application Priority Data

Sep. 26, 1997 [JP] Japan ................................. 9-261433

[51] Int. Cl.⁷ .................................................. H01L 29/41
[52] U.S. Cl. ........................................... 257/774; 257/341
[58] Field of Search ..................................... 257/773, 774, 257/382, 341, 342; 438/637, 638, 640, 667, 700, 701

[56] References Cited

U.S. PATENT DOCUMENTS

| | | | |
|---|---|---|---|
| 4,423,547 | 1/1984 | Farrar et al. | 257/640 |
| 4,502,069 | 2/1985 | Schuh | 257/341 |
| 4,785,344 | 11/1988 | Franz | 257/341 |
| 4,853,341 | 8/1989 | Nishioka et al. | 437/24 |
| 4,902,377 | 2/1990 | Berglund et al. | 156/643 |
| 5,304,837 | 4/1994 | Hierold | 257/341 |
| 5,444,020 | 8/1995 | Lee et al. | 257/775 |
| 5,525,544 | 6/1996 | Kariyazono et al. | 437/195 |
| 5,561,327 | 10/1996 | Jun | 257/758 |
| 5,828,263 | 10/1998 | Gantioler et al. | 257/341 |
| 5,925,911 | 7/1999 | Okabe et al. | 257/341 |

FOREIGN PATENT DOCUMENTS 4-314365 11/1992 Japan .

*Primary Examiner*—David B. Hardy
*Attorney, Agent, or Firm*—Foley & Lardner

[57] ABSTRACT

There is provided an insulating gate type semiconductor device including (a) a semiconductor region defining a cell region and a field region, the cell region including a drain region, a base region, and a source region, a first recess being formed throughout the source region and reaching an intermediate depth of the base region, (b) a gate insulating film partially covering an exposed surface of the source region therewith, entirely covering an exposed surface of the base region, and partially covering an exposed surface of the drain region therewith, (c) a gate electrode formed on the gate insulating film, (d) a field insulating film formed on the semiconductor region in the field region, (e) a first gate wiring layer formed on the field insulating film in electrical connection with the gate electrode, the first gate wiring layer being formed with a second recess, (f) a source electrode in electrical isolation from the gate electrode, but in electrical connection with both an inner surface of the first recess and a part of a surface of the base region, and (g) a second gate wiring layer in electrical connection with both an inner surface of the second recess and a part of a surface of the first gate wiring layer. The insulating gate type semiconductor device makes it possible to form a contact with a source electrode and a contact with a gate wiring layer in a single step without an increase in the number of steps of forming a photoresist film pattern.

15 Claims, 2 Drawing Sheets

VERTICAL MOSFET HAVING PENETRATING WIRING LAYERS

BACKGROUND OF THE INVENTION

1. Field of the Invention

The invention relates to an insulating gate type semiconductor device, and a method of fabricating the same, and more particularly to an insulating gate type semiconductor device such as vertical MOSFET as a power supplier and MOSFET modulating electrical conductivity, and a method of fabricating the same.

2. Description of the Related Art

FIG. 1 illustrates vertical MOSFET having a source region formed in a self-align fashion without carrying out photolithography steps.

The illustrated MOSFET includes a semiconductor region 1 including an $N^+$ type semiconductor substrate 2, and an epitaxial layer 3 formed at a surface of the $N^+$ type semiconductor substrate 2. The epitaxial layer 3 includes a P-type base region 4 formed at a surface of the epitaxial layer 3 in a selected region, an $N^+$ source region 5 formed at a surface of the base region 4 in a selected region, and an $N^-$ drain region 6 constituted of the epitaxial layer 3 as it is except the base region 4 and the source region 5. The epitaxial layer 3 is formed with a recess 7 passing throughout the source region 5 and reaching an intermediate depth of the base region 4.

A gate oxide film 8 is formed on the epitaxial layer 3 so that it covers the drain region 6, the base region 4, and a part of the source region 5 therewith, and a gate electrode 9 composed of polysilicon is formed on the gate oxide film 8.

An interlayer insulating film 10 covers the gate electrode 9 and a part of the source region 5 therewith. A source electrode 11 covers the interlayer insulating film 10, and a part of the source region 5 around the recess 7, and fills the recess 7 therewith. A drain electrode 12 is formed at a lower surface of the semiconductor substrate 2.

Japanese Unexamined Patent Publication No. 4-314365 has suggested a method of fabricating MOSFET illustrated in FIG. 1. Hereinbelow is explained the method.

First, a semiconductor region 1 including an $N^+$ type semiconductor substrate 2, and an epitaxial layer 3 formed on the semiconductor substrate 2 and lightly doped with N-type impurities is thermally oxidized at a surface thereof to thereby form a gate oxide film 8 at a surface of the semiconductor region 1.

Then, a polysilicon film is formed on the gate oxide film 8, and a photoresist film pattern is formed on the polysilicon film. Thereafter, both the gate oxide film 8 and the polysilicon film are etched with the photoresist film pattern being used as a mask, to thereby form a window through which the epitaxial layer 3 is exposed. Then, boron (B) and arsenic (As) are successively ion-implanted into the epitaxial layer 3 through the window, followed by thermal diffusion, to thereby form a base region 4 and a source region 5 in the epitaxial layer 3.

Then, an interlayer insulating film 10 is deposited all over the product. After forming a photoresist film pattern on the interlayer insulating film 10, the interlayer insulating film 10 is etched with the photoresist film pattern being used as a mask, to thereby form a contact hole. Then, the epitaxial layer 3 is etched again with the photoresist film pattern being used as a mask again, to thereby form a recess 7 throughout the source region 5.

After over-etching the interlayer insulating film 10, the photoresist film pattern is removed. At this stage, an inner surface of the recess 7 and a part of the source region 5 are exposed. Then, metal is deposited over the product, and unnecessary portions of the metal are etched for removal. Thus, the source electrode 11 is completed. Then, metal is evaporated onto a lower surface of the semiconductor substrate 2 to thereby form a drain electrode 12.

Though FIG. 1 illustrates MOSFET constituted of a single cell, MOSFET is actually constituted of a plurality of cells. A gate polysilicon wiring layer is formed on the epitaxial layer 3 with a field oxide layer sandwiched therebetween concurrently with the gate electrode 9. After forming an interlayer insulating film on the polysilicon wiring layer, a gate metal wiring layer is also formed on the interlayer insulating film concurrently with the source electrode 11 so that the gate metal wiring layer makes electrical contact with the gate polysilicon wiring layer. The gate electrodes 9 of the cells are electrically in connection with gate pads through the gate polysilicon wiring layer and the gate metal wiring layer.

The above-mentioned method has a problem as follows.

In the above-mentioned method, when a contact between the gate polysilicon wiring layer and the gate metal wiring layer is made concurrently with a contact between the source and base regions 4, 5 and the source electrode 11, the latter contact being made by etching the interlayer insulating film 10 with a photoresist film pattern being used as a mask, to thereby form a contact hole therethrough, etching the epitaxial layer 3 with the photoresist film pattern being used again as a mask, to thereby form the recess 7, and over-etching the interlayer insulating film 10, there may be formed a recess passing through the gate polysilicon wiring layer in dependence on a thickness of the gate polysilicon wiring layer. As a result, while the interlayer insulating film 10 is being etched, the field oxide film is also over-etched through the recess passing through the gate polysilicon wiring layer, and further side-etched below the gate polysilicon layer, which causes the field oxide layer to have a reduced thickness, and also causes less reliability. In the worst case, the gate metal wiring layer may be short-circuited with the semiconductor region 1.

SUMMARY OF THE INVENTION

It is an object of the present invention to provide an insulating gate type semiconductor device and a method of fabricating the same both of which are capable of making both a contact with a source electrode and a contact with a gate metal wiring layer in a single step without increasing the number of steps of forming photoresist film patterns.

In one aspect of the present invention, there is provided an insulating gate type semiconductor device including (a) a semiconductor region defining a cell region and a field region, the cell region including a drain region, a base region formed at a surface of the drain region, and a source region formed at a surface of the base region, a first recess being formed throughout the source region and reaching an intermediate depth of the base region, (b) a gate insulating film partially covering an exposed surface of the source region therewith, entirely covering an exposed surface of the base region, and partially covering an exposed surface of the drain region therewith, (c) a gate electrode formed on the gate insulating film, (d) a field insulating film formed on the semiconductor region in the field region, (e) a first gate wiring layer formed on the field insulating film in electrical connection with the gate electrode, the first gate wiring layer being formed with a second recess, (f) a source electrode in electrical isolation from the gate electrode, but in electrical connection with both an inner surface of the first recess and a part of a surface of the base region, and (g) a second gate wiring layer in electrical connection with both an inner surface of the second recess and a part of a surface of the first gate wiring layer.

There is further provided an insulating gate type semiconductor device including (a) a semiconductor substrate, (b) an epitaxial layer formed at a surface of the semiconductor substrate, and defining a cell region and a field region, the cell region including a drain region, a base region formed at a surface of the drain region, and a source region formed at a surface of the base region, a first recess being formed throughout the source region and reaching an intermediate depth of the base region, (c) a gate insulating film partially covering an exposed surface of the source region therewith, entirely covering an exposed surface of the base region, and partially covering an exposed surface of the drain region therewith, (d) a gate electrode formed on the gate insulating film, (e) a field insulating film formed on the epitaxial layer in the field region, (f) a first gate wiring layer formed on the field insulating film in electrical connection with the gate electrode, the first gate wiring layer being formed with a second recess, (g) a source electrode in electrical isolation from the gate electrode, but in electrical connection with both an inner surface of the first recess and a part of a surface of the base region, and (h) a second gate wiring layer in electrical connection with both an inner surface of the second recess and a part of a surface of the first gate wiring layer.

In accordance with the above-mentioned semiconductor device, the source electrode makes contact with both the source and base regions at an inner surface of the first recess formed passing through the source region, and further with a part of a surface of the source region. The second gate wiring layer makes contact with the first gate wiring layer at an inner surface of the second recess formed in the second gate wiring layer, and further with a part of a surface of the first gate wiring layer. Hence, both the source electrode and the second gate wiring layer can have a greater contact area than a contact area they could have when they make contact only at an inner surface of a recess, which ensures stability in electric performances.

The second recess may be designed to pass throughout the first gate wiring layer and reach an intermediate depth of the field insulating film.

It is preferable that the gate insulating film and the field insulating film are composed of a common material. For instance, the first gate wiring layer may be composed of polysilicon.

It is preferable that the drain region is lightly doped with impurities, and the source region is heavily doped with impurities.

The insulating gate type semiconductor device may further include an epitaxial layer in which the drain region, base region, and source region are formed. The semiconductor region may include a semiconductor substrate having the same conductivity as that of the drain region, and the epitaxial layer is formed on the semiconductor substrate, in which case, the semiconductor device constitutes MOSFET.

The semiconductor region may include a semiconductor substrate having an opposite conductivity to that of the drain region, and the epitaxial layer is formed on the semiconductor substrate, in which case, the semiconductor device constitutes MOSFET modulating electrical conductivity.

In another aspect of the present invention, there is provided a method of fabricating an insulating gate type semiconductor device, including the steps of (a) forming a base region at a surface of a semiconductor region in a cell region, a source region at a surface of the base region, a gate insulating film on the semiconductor region in the cell region, a field insulating film on the semiconductor region in the field region, a gate electrode on the gate insulating film, and a first gate wiring layer on the field insulating film in electrical connection with the gate electrode, (b) forming an interlayer insulating film on the semiconductor region, (c) forming a photoresist film on the interlayer insulating film in such a manner that the photoresist film has openings above both the source region and the first gate wiring layer, (d) wet-etching the interlayer insulating film with the photoresist film being used as a mask, to thereby expose the source region and the first gate wiring layer, (e) ion-etching the exposed source region with the photoresist film being used as a mask, to thereby form a first recess passing through the source region and reaching an intermediate depth of the base region, (f) ion-etching the exposed first gate wiring layer with the photoresist film being used as a mask, to thereby form a second recess in the first gate wiring layer, (g) forming a source electrode making contact with the source region at a surface thereof, and further with the source and base regions at an inner surface of the first recess, and (h) forming a second gate wiring layer making contact with the first gate wiring layer at a surface thereof and further at an inner surface of the second recess.

In accordance with the above-mentioned method, the interlayer insulating film is wet-etched with the photoresist film pattern being used as a mask, to thereby expose the semiconductor region and the first gate wiring layer in a greater area than an area of openings of the photoresist film pattern. Then, the exposed semiconductor region and first gate wiring layer is formed at a surface thereof with the recesses with the previously employed photoresist film pattern being used again as a mask. The thus formed recesses have almost the same area as an area of the openings of the photoresist film pattern. Hence, the source electrode makes contact with the source and base regions at an inner surface of the first recess, and further at a part of a surface of the source region. The second gate wiring layer makes contact with the first gate wiring layer at an inner surface of the second recess, and further at a part of a surface of the first gate wiring layer. This ensures an adequate contact area for both the source electrode and the second gate wiring layer.

In addition, since the interlayer insulating layer is over-etched by wet-etching, for instance, prior to etching (for instance, ion-etching) of the semiconductor region, the field insulating layer is never over-etched unlike a case where the interlayer insulating layer is over-etched after ion-etching of the semiconductor region.

There is further provided a method of fabricating an insulating gate type semiconductor device, including the steps of (a) forming a base region at a surface of a semiconductor region in a cell region, a source region at a surface of the base region, a gate insulating film on the semiconductor region in the cell region, a field insulating film on the semiconductor region in the field region, a gate electrode on the gate insulating film, and a first gate wiring layer on the field insulating film in electrical connection with the gate electrode, (b) forming an interlayer insulating film on the semiconductor region, (c) forming a photoresist film on the interlayer insulating film in such a manner that the photoresist film has openings above both the source region and the first gate wiring layer, (d) wet-etching the interlayer insulating film with the photoresist film being used as a mask, to thereby expose the source region and the first gate wiring layer, (e) over-etching the interlayer insulating film with the photoresist film being used as a mask so that an exposed area of the source region is greater than an area of the opening, (f) over-etching the interlayer insulating film with the photoresist film being used as a mask so that an exposed area of the first gate wiring layer is greater than an area of the opening, (g) ion-etching the exposed source region with the photoresist film being used as a mask, to thereby form a first recess passing through the source region and reaching an intermediate depth of the base region, (h) ion-etching the exposed first gate wiring layer with the photoresist film being used as a mask, to thereby form a second recess in the first gate wiring layer, (i) forming a source electrode making contact with the source region at a surface thereof, and further with the source and base regions at an inner surface of the first recess, and (j) forming a second gate wiring layer making contact with the first gate wiring layer at a surface thereof and further at an inner surface of the second recess.

In accordance with the above-mentioned method, etching of the interlayer insulating film is comprised of just-etching and over-etching. The interlayer insulating film is first just-etched with a photoresist film pattern being used as a mask, and then, over-etched for a certain period of time. Hence, the semiconductor region and the second gate wiring layer can be exposed accurately in an area greater than an area of openings of the photoresist film pattern.

It is preferable that the steps (e) and (f) are concurrently carried out. It is also preferable that the gate electrode and the first gate wiring layer are concurrently formed.

It is preferable that the first and second recesses are concurrently formed. The second recess may be formed to pass through the first gate wiring layer and reach an intermediate depth of the field insulating film.

For instance, the exposed source region and the exposed first gate wiring layer may be ion-etched in the steps (g) and (h). It is preferable that the gate electrode and the second gate wiring layer are concurrently formed.

The method may further include the step of forming an epitaxial layer in the semiconductor region so that the epitaxial layer includes the base and source regions and that a region in the epitaxial layer other than the base and source regions constitutes the drain region. For instance, the epitaxial layer is formed on a semiconductor substrate.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 1:
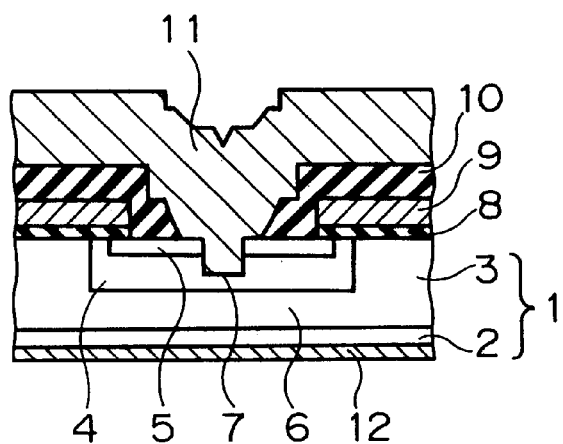
FIG. 1 is a cross-sectional view of a conventional vertical MOSFET.
Figure 2:
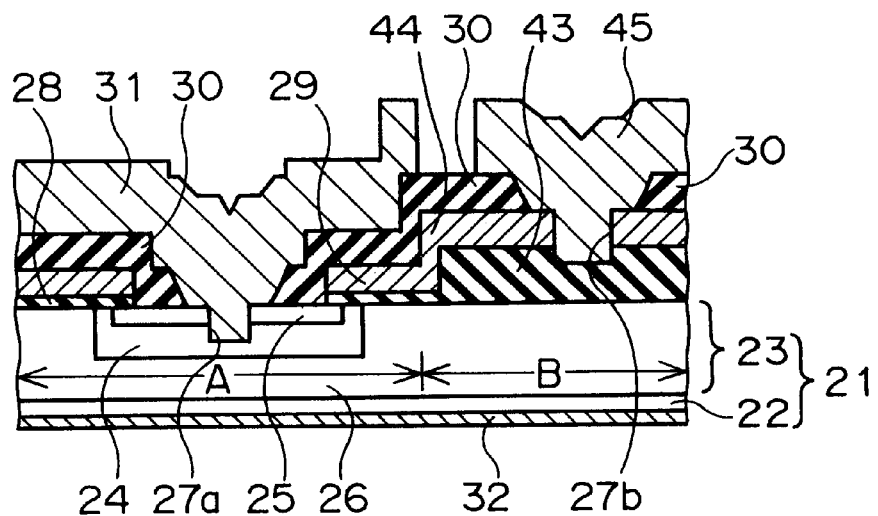
FIG. 2 is a cross-sectional view of a vertical MOSFET in accordance with the embodiment of the present invention.

FIG. 2 illustrates vertical MOSFET in accordance with a preferred embodiment of the present invention.

The illustrated MOSFET includes a semiconductor region 21 including an $N^+$ type semiconductor substrate 22 heavily doped with impurities, and an epitaxial layer 23 formed at a surface of the $N^+$ type semiconductor substrate 22. The epitaxial layer 23 defines a cell region A and a field region B. The cell region A includes a P-type base region 24 formed at a surface of the epitaxial layer 23 in a selected region, an $N^+$ source region 25 formed at a surface of the base region 24 in a selected region, and an $N^-$ drain region 26 constituted of the epitaxial layer 23 as it is except the base region 24 and the source region 25. The epitaxial layer 23 is formed with a first recess 27a passing throughout the source region 25 and reaching an intermediate depth of the base region 24.

A gate oxide film 28 is formed on the epitaxial layer 23 so that it covers the drain region 26, the base region 24, and a part of the source region 25 therewith, and a gate electrode 29 composed of polysilicon is formed on the gate oxide film 28.

A field oxide film 43 is formed on the epitaxial layer 23 in the field region B. A first gate wiring layer 44 composed of polysilicon is formed on the field oxide film 43 in electrical connection with the gate electrode 29. A second recess 27b is formed having a depth reaching an intermediate depth of the field oxide film 43 throughout the first gate wiring layer 44. It should be noted that the second recess 27b may be designed to have a depth smaller than a thickness of the first gate wiring layer 44, namely, the second recess 27b may be formed only within the first gate wiring layer 44, not reaching the field oxide film 43.

An interlayer insulating film 30 covers the gate electrode 29, the source region 25, and the first gate wiring layer 44 therewith except a part of the source region 25 around the first recess 27a and a part of the first gate wiring layer 44 around the second recess 27b.

A source electrode 31 covers the interlayer insulating film 30, and a part of the source region 25 around the first recess 27a, and fills the first recess 27a therewith in the cell region A. A second gate wiring layer 45 composed of metal such as aluminum covers the interlayer insulating layer 30, and a part of the first gate wiring layer 44 around the second recess 27b, and fills the second recess 27b therewith in the field region B. A drain electrode 32 is formed at a lower surface of the semiconductor substrate 22.

In the vertical MOSFET having the above-mentioned structure, the source electrode 31 makes contact with both the source region 25 and the base region 24 through an inner surface of the first recess 27a, and further with a part of a surface of the source region 25 around the first recess 27a. The second gate wiring layer 45 makes contact with the first gate wiring layer 44 at an inner surface of the second recess 27b, and further at a part of a surface of the first gate wiring layer 44. Hence, both the source electrode 31 and the second gate wiring layer 45 can have a greater contact area than a contact area they could have when they make contact only at an inner surface of the first and second recesses 27a and 27b, which ensures stability in electric performances of the vertical MOSFET.

Hereinbelow is explained a method of fabricating the above-mentioned vertical MOSFET, with reference to FIGS. 3A to 3D and FIG. 2.

Figure 3A:
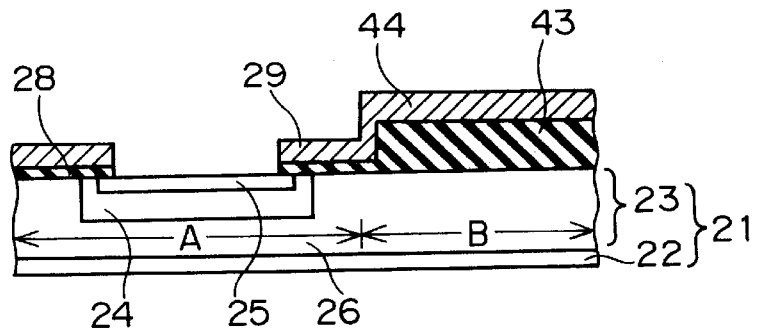
FIGS. 3A to 3D are cross-sectional views of the vertical MOSFET illustrated in FIG. 2, each illustrating respective step of a method of fabricating the same.

First, as illustrated in FIG. 3A, the field oxide film 43 is formed by thermal oxidation on the semiconductor region 21 including the $N^+$ semiconductor substrate 22, and the epitaxial layer 23 formed at a surface of the semiconductor substrate 22 and lightly doped with N-type impurities. The epitaxial layer 23 defines the cell region A and the field region B therein. A portion of the field oxide film 43 located in the cell region A is removed by photolithography and etching. A portion of the field oxide film 43 located in the field region B remains as it is.

Then, the gate oxide film 28 is formed by thermal oxidation on a surface of the epitaxial layer 23 in the cell region A where the field oxide film 43 used to exist. Then, a polysilicon film is deposited on the oxide films 43 and 28, and is patterned by photolithography and dry etching to thereby form both the gate electrode 29 composed of the polysilicon film remaining on the gate oxide film 28, and the first gate wiring layer 44 remaining on the field oxide film 43. The thus formed first gate wiring layer 44 is in electrical connection with the gate electrode 29.

Then, boron (B) and arsenic (As) are successively ion-implanted into the epitaxial layer 23 with the gate electrode 29 being used as a mask, followed by thermal diffusion, to thereby form the P-type base region 24 and the N$^+$ source region 25 in the epitaxial layer 23.

Figure 3B:
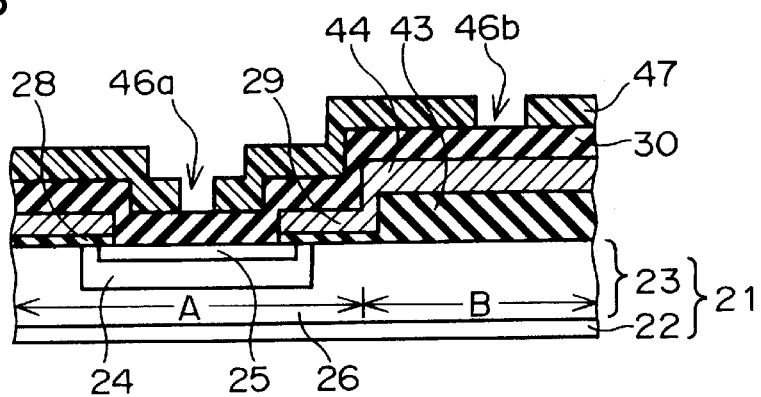

Then, as illustrated in FIG. 3B, the interlayer insulating film 30 is formed all over the semiconductor region 21, and thereafter, the resist pattern 47 is formed on the interlayer insulating film 30 by photolithography and etching. The resist pattern 47 has a first opening 46a on the source region 25, and a second opening 46b on the second gate wiring layer 44.

Figure 3C:
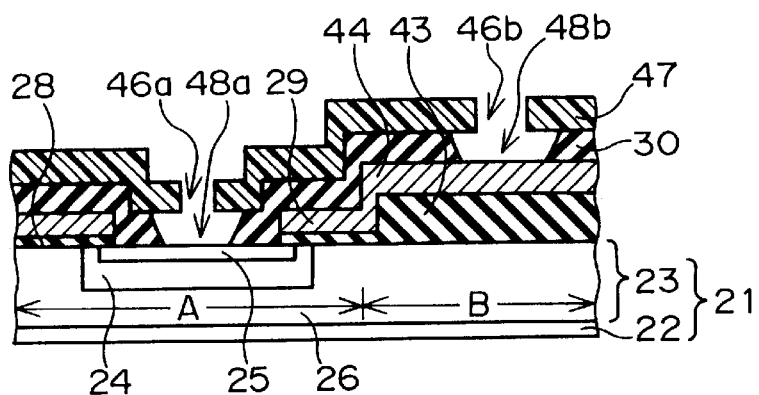

Then, as illustrated in FIG. 3C, the interlayer insulating film 30 is just-etched by wet-etching through the first and second openings 46a and 46b with the resist pattern 47 being used as a mask, until the epitaxial layer 23 and the first gate wiring layer 44 appear. Then, the interlayer insulating film 30 is further over-etched for a certain period of time with the resist pattern 47 being used again as a mask so that exposed areas of the source region 25 and the first gate wiring layer 44 are greater than areas of the first and second openings 46a and 46b of the resist pattern 47. Thus, there are formed contact holes 48a and 48b in the interlayer insulating film 30.

Figure 3D:
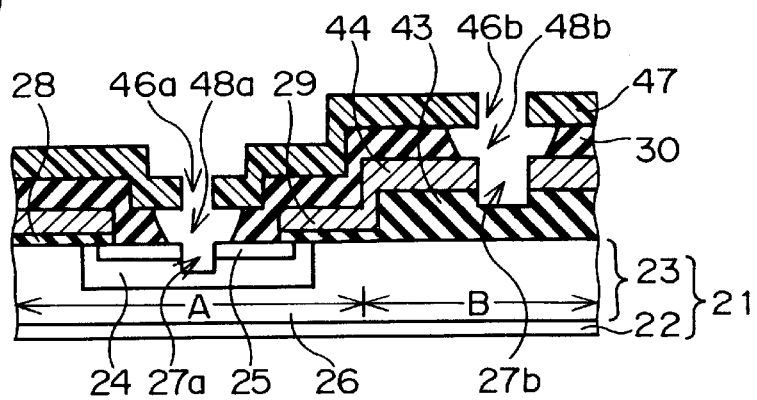

Then, as illustrated in FIG. 3D, the exposed epitaxial layer 23 is ion-etched with the resist pattern 47 being used again as a mask, to thereby form the first recess 27a passing through the source region 25 and reaching an intermediate depth of the base region 24. At the same time, the first gate wiring layer 44 is ion-etched with the resist pattern 47 being used again as a mask, to thereby form the second recess 27b passing through the first gate wiring layer 44 and reaching an intermediate depth of the filed oxide film 43. The second recess 27b may be designed to have a depth smaller than a thickness of the first gate wiring layer 44, namely, the second recess 27b may be formed only within the first gate wiring layer 44, not reaching the field oxide film 43.

Then, as illustrated in FIG. 2, after removing the resist pattern 47, an aluminum film is deposited over the semiconductor region 21 by vacuum evaporation. The aluminum film is patterned by photolithography and dry etching to thereby form both the source electrode 31 making electrical connection with the source region 25 and the base region 24, and the second gate wiring layer 45 making electrical connection with the first gate wiring layer 44. Then, a metal film is formed at a lower surface of the semiconductor region 21 by evaporation to thereby form the drain electrode 32.

In accordance with the above-mentioned embodiment, the interlayer insulating film 30 is just-etched by wet-etching and further over-etched for a certain period of time with the resist pattern 47 being used as a mask, to thereby expose the epitaxial layer 23 and the first gate wiring layer 44 in a greater exposure area than an area of the openings 46a and 46b of the resist pattern 47.

Then, the exposed epitaxial layer 23 and first gate wiring layer 44 is formed at a surface thereof with the first and second recesses 27a and 27b by ion-etching with the previously employed resist pattern 47 being used again as a mask. The thus formed first and second recesses 27a and 27b have almost the same area as an area of the first and second openings 46a and 46b of the resist pattern 47. Hence, the source electrode 31 makes contact with the source and base regions 25 and 24 at an inner surface of the first recess 27a, and further at a part of a surface of the source region 25. The second gate wiring layer 45 makes contact with the first gate wiring layer 44 at an inner surface of the second recess 27b, and further at a part of a surface of the first gate wiring layer 44. This ensures an adequate contact area for both the source electrode 31 and the second gate wiring layer 45.

In addition, since the interlayer insulating layer 30 is over-etched by wet-etching prior to the ion-etching of the epitaxial layer 23, the field insulating film 43 is never over-etched or side-etched below the first gate wiring layer 44 unlike a case where the interlayer insulating layer 30 is over-etched after the ion-etching of the epitaxial layer 23. Hence, there are not caused problems that the field oxide film 43 becomes too thin with the result of less reliability, and that the second gate wiring layer 45 is short-circuited with the semiconductor region 21 in the worst case.

In the above-mentioned embodiment, the source and drain regions 25 and 26 are of N-type, and the base region 24 is of P-type. However, it should be noted that they may be designed to have an opposite conductivity. That is, the source and drain regions 25 and 26 may be of P-type, and the base region 24 may be N-type.

Similarly, though the semiconductor substrate 22 is of N-type in the above-mentioned embodiment, the semiconductor substrate 22 may be of P-type, in which case, a P-type semiconductor substrate may be employed for a conductivity modulating type MOSFET.

Though the semiconductor region 21 in the above-mentioned embodiment consists of the semiconductor substrate 22 and the epitaxial layer 23, it should be noted that the semiconductor region 21 may consist only of the semiconductor substrate 22, in which case, the drain region 26, the base region 24, and the source region 25 are all formed in the semiconductor substrate 22.

In accordance with the present invention, in the step of forming the recesses through which the source electrode and the second gate wiring layer make contact with other elements, the interlayer insulating film is just-etched and then over-etched to thereby form contact holes therein, and subsequently, the epitaxial layer and the second gate wiring layer are ion-etched to thereby form the first and second recesses, employing the resist pattern as a mask. The resist pattern is formed by single photolithography. Hence, it is possible for the source electrode and the second gate wiring layer to make contact with other elements without an increase of steps of carrying out photolithography.

In addition, the source electrode makes contact with the source and base regions at an inner surface of the first recess, and further at a part of a surface of the source region. The second gate wiring layer makes contact with the first gate wiring layer at an inner surface of the second recess, and further at a part of a surface of the first gate wiring layer. This ensures an adequate contact area for both the source electrode and the second gate wiring layer. Thus, the contact areas would be increased, which ensures reliable electrical connection.

Furthermore, the field oxide film situated under the first gate wiring layer is not etched when the interlayer insulating layer is over-etched by wet etching. Hence, it is possible to prevent the second gate wiring layer and the semiconductor region from being short-circuited therebetween, and the field oxide film from becoming too thin.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 9-261433 filed on Sept. 26, 1997 including specification, claims, drawings and summary is incorporated herein by reference in its entirety.

What is claimed is:

1. An insulating gate type semiconductor device comprising:
   (a) a semiconductor region defining a cell region and a field region, said cell region including a drain region, a base region formed at a surface of said drain region, and a source region formed at a surface of said base region, a first recess being formed throughout said source region and reaching an intermediate depth of said base region;
   (b) a gate insulating film partially covering an exposed surface of said source region therewith, entirely covering an exposed surface of said base region, and partially covering an exposed surface of said drain region therewith;
   (c) a gate electrode formed on said gate insulating film;
   (d) a field insulating film formed on said semiconductor region in said field region;
   (e) a first gate wiring layer formed on said field insulating film in electrical connection with said gate electrode, said first gate wiring layer being formed with a second recess;
   (f) a source electrode in electrical isolation from said gate electrode, but in electrical connection with both an inner surface of said first recess and a part of a surface of said base region; and
   (g) a second gate wiring layer in electrical connection with both an inner surface of said second recess and a part of a surface of said first gate wiring layer.

2. The insulating gate type semiconductor device as set forth in claim 1, wherein said second recess passes throughout said first gate wiring layer and reaches an intermediate depth of said field insulating film.

3. The insulating gate type semiconductor device as set forth in claim 1, wherein said gate insulating film and said field insulating film are composed of a common material.

4. The insulating gate type semiconductor device as set forth in claim 1, wherein said first gate wiring layer is composed of polysilicon.

5. The insulating gate type semiconductor device as set forth in claim 1, wherein said drain region is lightly doped with impurities, and said source region is heavily doped with impurities.

6. The insulating gate type semiconductor device as set forth in claim 1, further comprising an epitaxial layer in which said drain region, base region, and source region are formed.

7. The insulating gate type semiconductor device as set forth in claim 6, wherein said semiconductor region includes a semiconductor substrate having the same conductivity as that of said drain region, and said epitaxial layer is formed on said semiconductor substrate.

8. The insulating gate type semiconductor device as set forth in claim 7, wherein said semiconductor device constitutes MOSFET.

9. The insulating gate type semiconductor device as set forth in claim 6, wherein said semiconductor region includes a semiconductor substrate having an opposite conductivity to that of said drain region, and said epitaxial layer is formed on said semiconductor substrate.

10. The insulating gate type semiconductor device as set forth in claim 9, wherein said semiconductor device constitutes MOSFET modulating electrical conductivity.

11. An insulating gate type semiconductor device comprising:
    (a) a semiconductor substrate;
    (b) an epitaxial layer formed at a surface of said semiconductor substrate, and defining a cell region and a field region, said cell region including a drain region, a base region formed at a surface of said drain region, and a source region formed at a surface of said base region, a first recess being formed throughout said source region and reaching an intermediate depth of said base region;
    (c) a gate insulating film partially covering an exposed surface of said source region therewith, entirely covering an exposed surface of said base region, and partially covering an exposed surface of said drain region therewith;
    (d) a gate electrode formed on said gate insulating film;
    (e) a field insulating film formed on said epitaxial layer in said field region;
    (f) a first gate wiring layer formed on said field insulating film in electrical connection with said gate electrode, said first gate wiring layer being formed with a second recess;
    (g) a source electrode in electrical isolation from said gate electrode, but in electrical connection with both an inner surface of said first recess and a part of a surface of said base region; and
    (h) a second gate wiring layer in electrical connection with both an inner surface of said second recess and a part of a surface of said first gate wiring layer.

12. The insulating gate type semiconductor device as set forth in claim 11, wherein said second recess passes throughout said first gate wiring layer and reaches an intermediate depth of said field insulating film.

13. The insulating gate type semiconductor device as set forth in claim 11, wherein said gate insulating film and said field insulating film are composed of a common material.

14. The insulating gate type semiconductor device as set forth in claim 11, wherein said first gate wiring layer is composed of polysilicon.

15. The insulating gate type semiconductor device as set forth in claim 11, wherein said drain region is lightly doped with impurities, and said source region is heavily doped with impurities.

* * * * *